(12) United States Patent  
Harris et al.

(10) Patent No.: US 10,149,418 B2
(45) Date of Patent: Dec. 4, 2018

(54) PROTECTIVE SLEEVE WITH BONDED WIRE FILAMENTS AND METHODS OF CONSTRUCTION THEREOF

(71) Applicant: FEDERAL-MOGUL POWERTRAIN, INC., Southfield, MI (US)

(72) Inventors: David A. Harris, Coatesville, PA (US); Ming-Ming Chen, West Chester, PA (US); Michael Piotrowski, Plymouth Meeting, PA (US)

(73) Assignee: Federal-Mogul Powertrain LLC, Southfield, MI (US)

( * ) Notice: Subject to any disclaimer, the term of this patent is extended or adjusted under 35 U.S.C. 154(b) by 0 days.

(21) Appl. No.: 15/078,341

(22) Filed: Mar. 23, 2016

(65) Prior Publication Data

US 2016/0201232 A1    Jul. 14, 2016

Related U.S. Application Data

(62) Division of application No. 14/333,342, filed on Jul. 16, 2014, now Pat. No. 9,307,685.

(51) Int. Cl.
*H05K 9/00* (2006.01)
*D03D 1/00* (2006.01)
(Continued)

(52) U.S. Cl.
CPC ......... *H05K 9/0098* (2013.01); *D03D 1/0035* (2013.01); *D03D 1/0088* (2013.01);
(Continued)

(58) Field of Classification Search
USPC ..................................... 174/117 M
See application file for complete search history.

(56) References Cited

U.S. PATENT DOCUMENTS 3,801,399 A    4/1974    Sundberg
4,668,545 A *  5/1987    Lowe ................. B29C 61/0658
                                            139/387 R
(Continued)

FOREIGN PATENT DOCUMENTS

CN    101405529 A    4/2009
CN    102459729 A    5/2012
CN    102483975 A    5/2012

OTHER PUBLICATIONS

International Search Report, dated Oct. 9, 2015 (PCT/US2015/038751).

*Primary Examiner* — Jeffry H Aftergut
(74) *Attorney, Agent, or Firm* — Robert L Stearns; Dickinson Wright, PLLC

(57) ABSTRACT

A fabric sleeve for protecting elongate members against at least one of EMI, RFI or ESD and method of construction thereof is provided. The sleeve includes a wall extending along a longitudinal axis between opposite ends. The wall is formed from a plurality of filaments interlaced with one another, with at least one of the filaments being provided as a continuous strand of conductive wire and at least some of the filaments being provided as heat-fusible nonconductive filaments. The heat-fusible nonconductive filaments abut the continuous strand of conductive wire at a plurality of bond joints. The continuous strand of conductive wire is at least partially embedded in bonded, fixed attachment with the heat-fusible nonconductive filaments at the bond joints.

10 Claims, 4 Drawing Sheets

(51) Int. Cl.
*D04C 1/06* (2006.01)
*D04B 1/22* (2006.01)
*D03D 3/02* (2006.01)
*D04C 1/02* (2006.01)
*D03D 15/00* (2006.01)
*D03D 15/02* (2006.01)

(52) U.S. Cl.
CPC ........... *D03D 3/02* (2013.01); *D03D 15/0027* (2013.01); *D03D 15/02* (2013.01); *D04B 1/225* (2013.01); *D04C 1/02* (2013.01); *D04C 1/06* (2013.01); *H05K 9/009* (2013.01); *H05K 9/0067* (2013.01); *H05K 9/0079* (2013.01); *H05K 9/0081* (2013.01); *D10B 2101/20* (2013.01); *D10B 2401/041* (2013.01); *D10B 2505/12* (2013.01)

(56) References Cited

U.S. PATENT DOCUMENTS

| | | | | |
|---|---|---|---|---|
| 4,684,762 | A * | 8/1987 | Gladfelter | D03D 15/00 174/117 M |
| 7,576,286 | B2 * | 8/2009 | Chen | D02G 3/441 174/117 M |
| 8,283,563 | B2 * | 10/2012 | Harris | D02G 3/441 174/117 M |
| 2007/0166495 | A1 | 7/2007 | Sellis et al. | |

\* cited by examiner

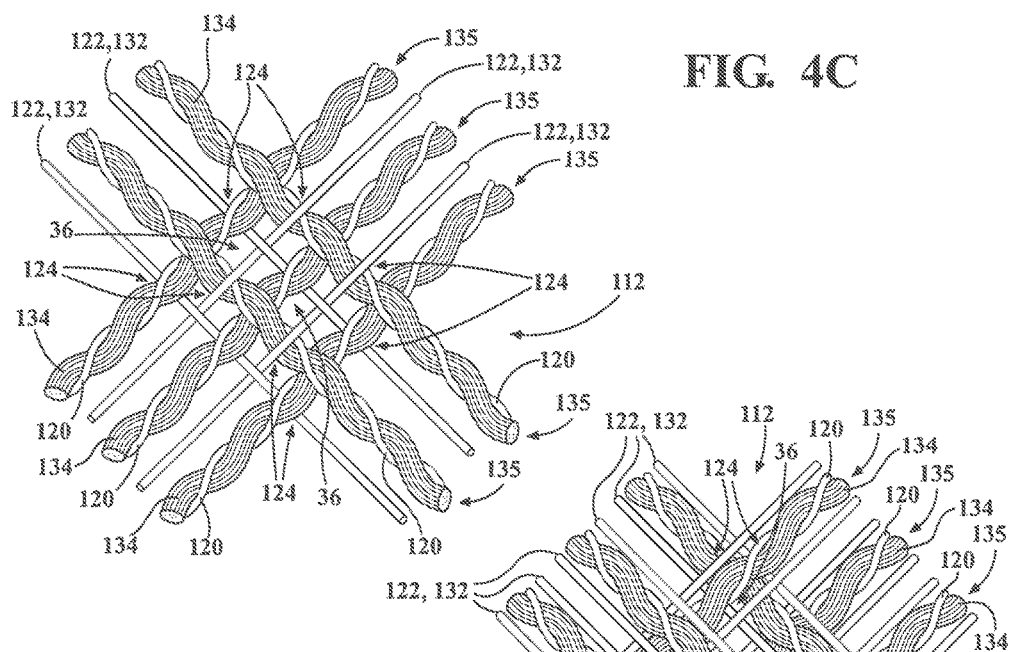
FIG. 4C
FIG. 4D
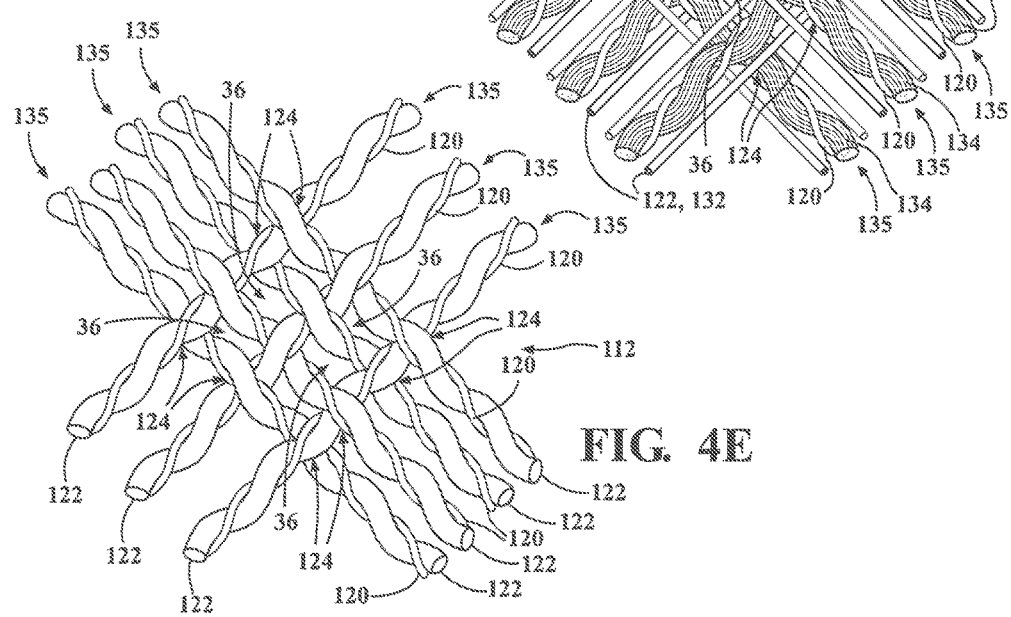
FIG. 4E

PROTECTIVE SLEEVE WITH BONDED WIRE FILAMENTS AND METHODS OF CONSTRUCTION THEREOF

This Divisional application claims priority to U.S. Utility application Ser. No. 14/333,342, filed Jul. 16, 2014, and is incorporated herein by reference.

BACKGROUND OF THE INVENTION

1. Technical Field

This invention relates generally to tubular sleeves for protecting elongate members, and more particularly to tubular sleeves having wire filaments that provide protection against at least one of electromagnetic interference, radio frequency interference, and electrostatic discharge.

2. Related Art

It is known that electromagnetic interference (EMI), radio frequency interference (RFI), and electrostatic discharge (ESD) pose a potential problem to the proper functioning of electronic components caused by interference due to inductive coupling between nearby electrical conductors and propagating electromagnetic waves. For example, electrical currents in conductors associated with an electrical power system in an automobile may induce spurious signals in various electronic components, such as an electronic module which controls the functioning of the engine. Such interference could downgrade the performance of control modules or other components in the vehicle, thereby causing the vehicle to act other than as desired.

Similarly, inductive coupling between electrical wiring and the lines carrying data in a computer network or other communication system may have a corrupting effect on the data being transmitted over the network.

The adverse effects of EMI, RFI and ESD can be effectively eliminated by proper shielding and grounding of EMI, RFI and ESD sensitive components. For example, wires carrying control signals which may be subjected to unwanted interference may be shielded by using a protective sleeve. The sleeves can be generally flat or cylindrical, wherein the sleeves are formed from electrically conductive and non-conductive constituents, with the conductive constituents typically being grounded via a drain wire interlaced with the sleeve during manufacture of the sleeve. Typically, the conductive constituents take the form of polymeric filaments, such as nylon, coated with a conductive metal, such as a silver coating. Otherwise, it is known to twist or serve individual strands of wire with standard, nonconductive monofilament and/or multifilament yarn to form a conductive "hybrid yarn."

While RFI, EMI, and ESD sleeves constructed as described above can be generally effective at eliminating electrical interference, the sleeves can be relatively expensive in manufacture, particularly when expensive coatings, such as silver, are used, and can exhibit some inefficiency in establishing and maintaining conductive connections between the conductive fiber constituents. In addition, the conductive coating can be worn off, thereby impacting the ability of the sleeving to provide and maintain RFI, EMI, and/or ESD protection. Further, the sleeves constructed with hybrid yarns, with wire being twisted or served with standard, nonconductive monofilament and/or multifilament yarn typically exhibit end fray upon being cold cut, as the wire and standard, nonconductive monofilament and/or multifilament yarn are not fixed or otherwise bonded with one another, and thus, they are free to move relative to one another. Further, the hybrid yarns tend to shift relative to one another upon being interlaced, thereby potentially negatively impacting the ability to provide and maintain maximum shielding against EMI, RFI and/or ESD. The shifting has a negative impact as a result of the wires moving from their intended location, which tends to form enlarged openings between the wires, wherein the enlarged openings degrade the EMI, RFI, ESD shielding performance of the sleeve. Accordingly, RFI, EMI, ESD shielding which is more economical and resistant to end fray in manufacture, more efficient and less susceptible to alteration, shifting of interlaced wires or damage in use, more reliable against wear, and exhibiting an increased useful life, is desired.

A protective sleeve manufactured in accordance with the present invention overcomes or greatly minimizes at least those limitations of the prior art described above.

SUMMARY OF THE INVENTION

A fabric sleeve for protecting elongate members against at least one of EMI, RFI or ESD is provided. The sleeve includes a wall extending along a longitudinal axis between opposite ends. The wall is formed from a plurality of filaments interlaced with one another, with at least one of the filaments being provided as a continuous strand of conductive wire and at least some of the filaments being provided as heat-fusible nonconductive filaments. The heat-fusible nonconductive filaments abut the continuous strand of conductive wire at a plurality of bond joints. The continuous strand of conductive wire is at least partially embedded in bonded, fixed attachment with the heat-fusible nonconductive filaments at the bond joints.

In accordance with another aspect of the invention, the wall can have opposite edges extending generally parallel to the longitudinal central axis and further include at least one heat-set filament biasing the opposite edges into overlapping relation with one another.

In accordance with another aspect of the invention, the heat-fusible nonconductive filaments can be a monofilament.

In accordance with another aspect of the invention, the heat-fusible nonconductive filaments can be a multifilament.

In accordance with another aspect of the invention, the heat-set filament can be a monofilament.

In accordance with another aspect of the invention, the heat-fusible nonconductive monofilaments and the at least one heat-set monofilament can be provided as a bicomponent monofilament having an outer sheath of heat-fusible material having a first melt temperature and an inner core of heat-settable material having a second melt temperature that is greater than said first melt temperature.

In accordance with another aspect of the invention, at least some of the bicomponent monofilaments can extend circumferentially about the longitudinal axis.

In accordance with another aspect of the invention, the wall can be woven with warp yarn extending generally parallel to the longitudinal axis and weft yarn extending generally transverse to the longitudinal axis, wherein at least some of the warp yarn can be provided as a continuous strand of conductive wire and at least some of the weft yarn can be provided as a heat-fusible nonconductive monofilament and a heat-set monofilament, or a bi-component, heat-fusible sheath/heat-settable core, monofilament.

In accordance with another aspect of the invention, the plurality of filaments can be braided with one another to form generally diamond-shaped openings, wherein the generally diamond-shaped openings are substantially maintained in size and shape by the bond joints.

In accordance with another aspect of the invention, the heat-fusible non-conductive filaments can be multifilaments.

In accordance with another aspect of the invention, the wall can be seamless and circumferentially continuous about the longitudinal axis.

In accordance with another aspect of the invention, a method of constructing a fabric sleeve for protecting elongate members against at least one of EMI, RFI or ESD is provided. The method includes forming a wall extending along a longitudinal axis between opposite ends by interlacing a plurality of filaments with one another and providing at least one of the filaments as a continuous strand of conductive wire and at least one of the filaments as a heat-fusible nonconductive filament. Further, at least partially embedding the continuous strand of conductive wire in the heat-fusible nonconductive filament and fixing the continuous strand of conductive wire against relative movement with the heat-fusible nonconductive filament.

In accordance with another aspect of the invention, the method can further include heat-fusing the heat-fusible nonconductive filament in bonded, fixed attachment with the continuous strand of conductive wire.

In accordance with another aspect of the invention, the method can further include biasing opposite edges of the wall into overlapping relation with one another by heat-setting at least one of said plurality of filaments.

In accordance with another aspect of the invention, the method can further include performing the heat-fusing and heat-setting in a simultaneous operation.

In accordance with another aspect of the invention, the method can further include performing the interlacing in a weaving process.

In accordance with another aspect of the invention, the method can further include weaving the continuous strand of wire in a warp direction extending generally parallel to the longitudinal axis and in a weft direction extending generally transverse to the longitudinal axis.

In accordance with another aspect of the invention, the method can further include providing the heat-fusible nonconductive filament as a bicomponent monofilament having an outer sheath of heat-fusible material having a first melt temperature and an inner core of heat-settable material having a second melt temperature that is greater than said first melt temperature.

In accordance with another aspect of the invention, the method can further include heat-fusing an outer sheath of a bicomponent in bonded, fixed attachment with the continuous strand of conductive wire and biasing opposite edges of the wall into overlapping relation with one another by heat-setting an inner core of the bicomponent.

In accordance with another aspect of the invention, the method can further include providing the continuous strand of conductive wire as a hybrid filament including the at least one continuous strand of conductive wire twisted or served with a non-conductive multifilament.

In accordance with another aspect of the invention, the method can further include performing the interlacing in a braiding process.

In accordance with another aspect of the invention, the method can further include performing the interlacing in a knitting process.

BRIEF DESCRIPTION OF THE DRAWINGS

These and other features and advantages will become readily apparent to those skilled in the art in view of the following detailed description of the presently preferred embodiments and best mode, appended claims, and accompanying drawings, in which:

FIGS. 4A-4E are enlarged schematic partial views of walls of sleeves constructed in accordance with various aspects of the invention.

DETAILED DESCRIPTION OF PREFERRED EMBODIMENTS

Figure 1A:
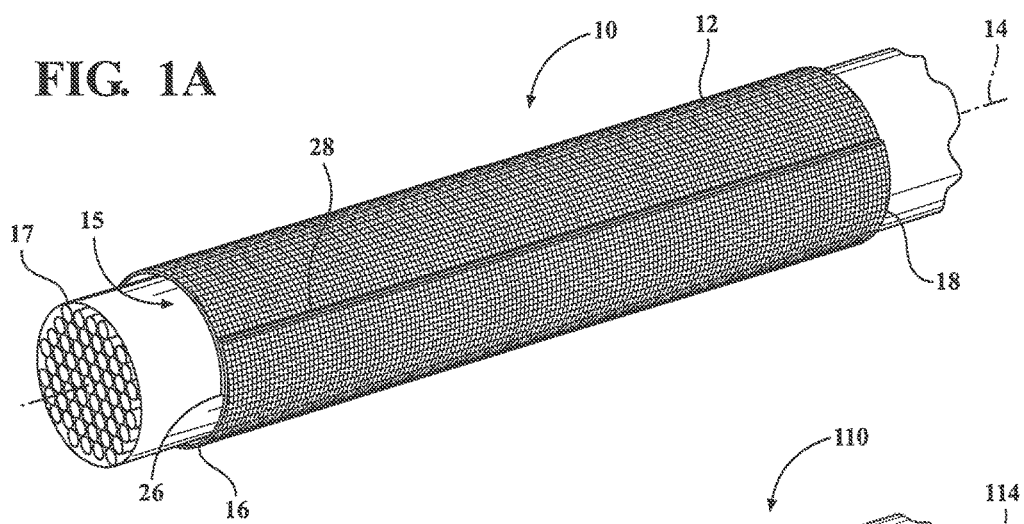
FIG. 1A is a perspective view of a self-wrapping sleeve constructed in accordance with one presently preferred embodiment of the invention.

Referring in more detail to the drawings, FIG. 1A shows a self-wrapping sleeve 10 constructed according in accordance with one presently preferred embodiment of the invention. The sleeve 10 has a wall 12 extending along a longitudinal axis 14 between opposite open ends 16, 18, and forms a cavity 15 for protective receipt of an elongate member or members 17 to be protected, such as wire or a wire harness, by way of example and without limitation. The wall 12 is formed from a plurality of filaments interlaced with one another, wherein the term filaments is intended to include monofilaments and/or multifilaments, with specific reference being given to the type of filament, as necessary, hereafter. At least one of the filaments is provided as a continuous strand of conductive wire 20 (FIGS. 3A-3C) and at least some of the filaments are provided as heat-fusible nonconductive filaments 22 (FIGS. 3D-3F), whether being heat-fusible monofilaments or heat-fusible multifilaments. The heat-fusible nonconductive filaments 22 abut the continuous strand of conductive wire 20 at a plurality of heat-fused bond joints, also referred to as nodes 24, and in some cases, abut the conductive wire 20 along its entire or substantially entire length. The continuous strand of conductive wire 20 is at least partially embedded and bonded in fixed attachment with the heat-fusible nonconductive filaments 22 at the nodes 24, and possibly along its length, thus fixing the wire 20 in its intended location against inadvertent movement relative to the filament to which it is bonded, thereby maximizing and maintaining the electro-shield effectiveness of the sleeve 10 against at least one of electromagnetic interference (EMI), radiofrequency interference (RFT) or electrostatic discharge (ESD), while also preventing end fray of the wires 20 and other filaments, such as during and after cold cutting operations used to form the ends 16, 18.

The wall 12 can be formed as a circumferentially continuous and seamless wall (FIG. 2), sometimes referred to as a "closed sleeve", or as an "open" sleeve (FIG. 1A) having opposite edges 26, 28 extending generally parallel to the longitudinal axis 14. To facilitate biasing the opposite edges 26, 28 of an open-type construction into overlapping relation with one another, the wall 12 can further include at least one nonconductive heat-settable polymeric filament 30, such as monofilaments of polyethylene terephthalate (PET) or polyphenylene sulfide (PPS), for example, which can be heat-set at a temperature between about 200-225 degrees Celsius. The heat-fusible nonconductive filaments 22 and the heat-settable non-conductive filaments 30 can be provided as a bicomponent monofilament 32 (FIG. 3C) having an outer sheath of material having a first melt temperature forming the heat-fusible non-conductive filament 22 and a central core of heat-settable material having a second melt temperature that is greater than the first melt temperature forming the non-conductive heat-settable filament 30.

In one presently preferred embodiment, the wire 20, such as stainless steel, by way of example and without limitation, is served (FIG. 3B) or twisted (FIG. 3C) with a nonconductive filament 34, such as a nonconductive multifilament 34, by way of example and without limitation, wherein the multifilament 34 can be provided as any desired material. The combined wire 20 and nonconductive filament 34 form a hybrid yarn 35 that can be interlaced as a single yarn filament. The non-conductive member 34 is preferably provided as a multifilament yarn, which provides the sleeve 10 with softer texture, enhanced drape, and enhanced noise dampening characteristics, though, monofilaments could be used for the nonconductive member 34, if desired for the intended application. Depending on the application, the non-conductive members 34 can be formed from, by way of example and without limitations, polyester, nylon, polypropylene, polyethylene, acrylic, cotton, rayon, and fire retardant (FR) versions of all the aforementioned materials, though high temperature ratings are generally not required if provided as FR materials. If high temperature ratings are desired along with FR capabilities, then some presently preferred non-conductive members include m-aramid (Nomex, Conex, Kermel), p-aramid (Kevlar, Twaron, Technora), PEI (Ultem), PPS, and PEEK, for example. The individual filaments of wire 20 are about 50-150 μm in diameter, for example, and provide the sleeve 10 with at least one of electromagnetic interference (EMI), radio frequency interference (RFI), and/or electrostatic discharge (ESD) protection for the elongate member or members 17 bundled within the sleeve 10. Once enclosed within the cavity 15 of the sleeve 10, the elongate member 17 receives maximum protection from any unwanted electro-interference, such as inductive interference, thereby providing any electrical components, such as control motors, for example, connected to the elongate member 17 with maximum operating efficiency. In addition, the sleeve 10 prevents the bundled elongate member 17 from interfering electrically with any adjacent electrical components.

Figure 4A:
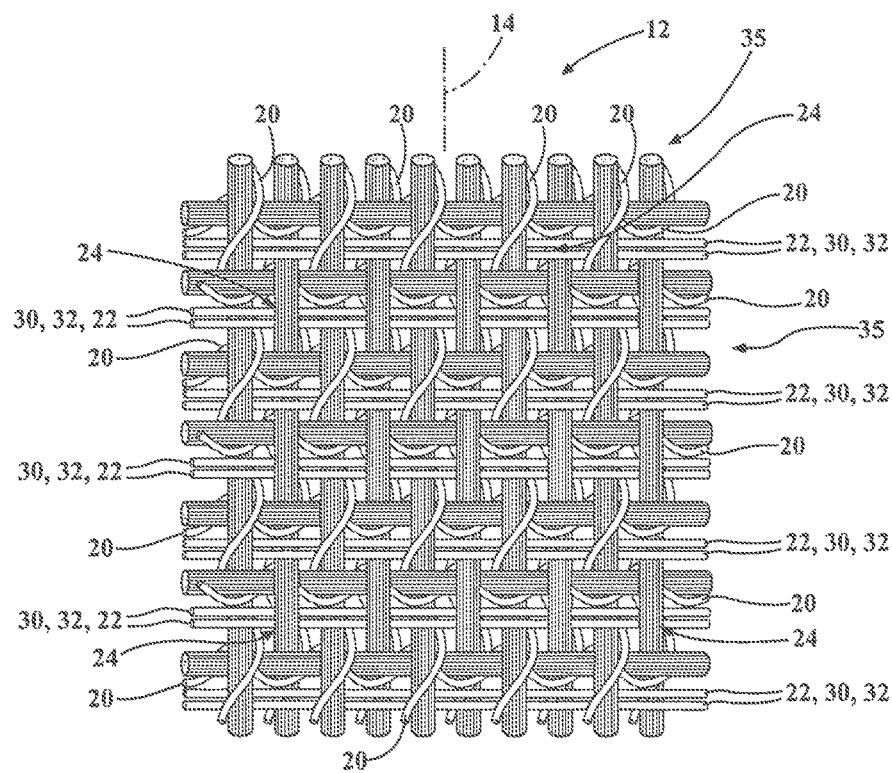

As shown in FIG. 4A, the wall 12 is shown with the hybrid yarn 35 interlaced to extend along a warp direction, generally parallel with the longitudinal axis 14, and a weft (fill) direction, generally transverse to the longitudinal axis 14. The wall 12 is shown as being woven, such as in a plain weave pattern, though other weave patterns could be used, such as twill, satin, or otherwise. The wall 12 is shown as having only the hybrid yarns 35 extending along the warp direction; however, it includes the heat-fusible filaments 22 and heat-settable filaments 30 extending in the weft direction, wherein the heat-fusible filaments 22 and heat-settable filaments 30 can be provided as the bicomponent filaments 32, if desired. In the example shown, the weft-wise extending bicomponent filaments 32 are woven in side-by-side relation with one another and with corresponding ones of the hybrid yarns 35, and can be woven having one or more, and shown as a pair of bicomponent filaments 32, by way of example and without limitation, adjacent each hybrid yarn 35. As such, it should be recognized that the weft-wise extending hybrid yarn 35 and bicomponent yarn 32 can be woven in phase with one another such they extend over and under the same warp-wise extending hybrid filament 35. Otherwise, it is to be recognized that they can be woven individually from one another such that they are out of woven phase from one another.

Upon weaving the wall 12, the wall 12 can be curled to bring the opposite edges 26, 28 into overlapping relation with one another, whereupon suitable heat can be applied to the curled wall 12 to simultaneously heat-set the heat-settable filament(s) 30, without causing it to melt, while at the same time and temperature, at least partially causing the heat-fusible filament 22 to melt and then solidify in bonded relation with the wires 20 at bond joints 24 to fix the wires 20 in their "as interlaced" and an "as bonded" wrapped positions. Accordingly, the wire 20 is prevented from shifting from its "as interlaced" position upon being bonded and at least partially embedded in the heat-fused material of the heat-fusible filaments 22.

Figure 1B:
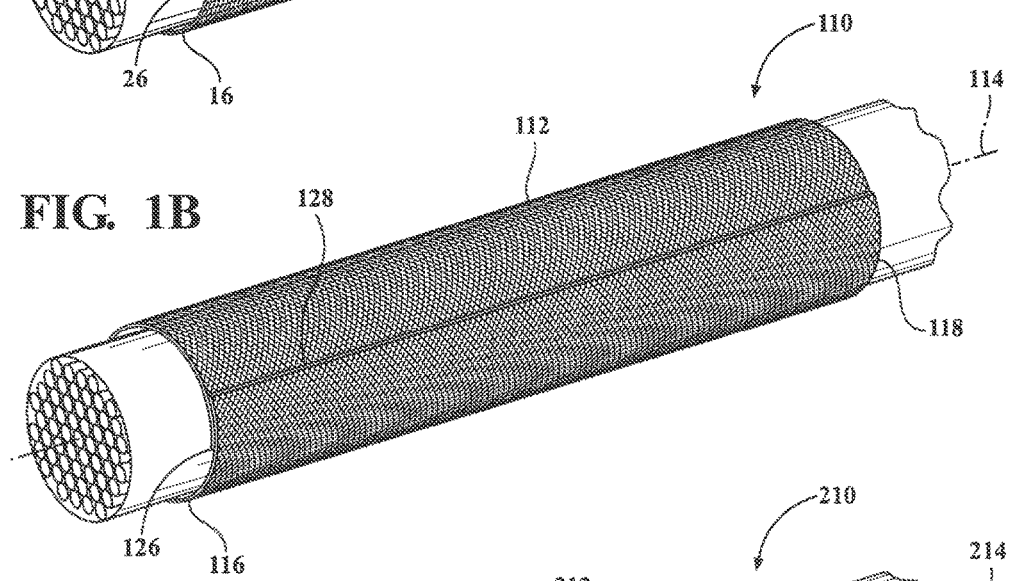
FIG. 1B is a perspective view of a self-wrapping sleeve constructed in accordance with another presently preferred embodiment of the invention.
Figure 2:
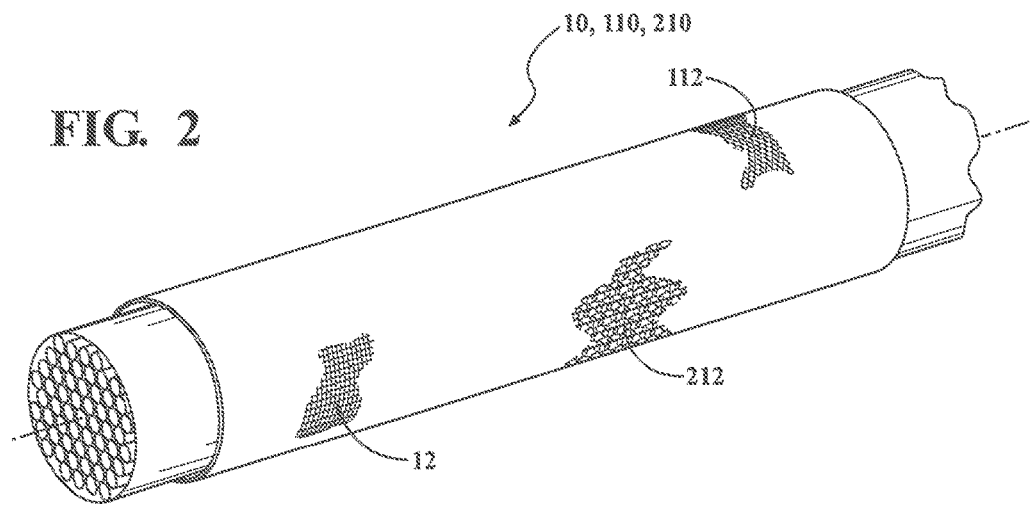
FIG. 2 is a perspective view of a seamless sleeve constructed in accordance with another embodiment of the invention.
Figure 3A:
FIG. 3A-3F are enlarged views of filaments used to construct sleeves in accordance with various aspects of the invention.
Figure 3B:
Figure 3C:
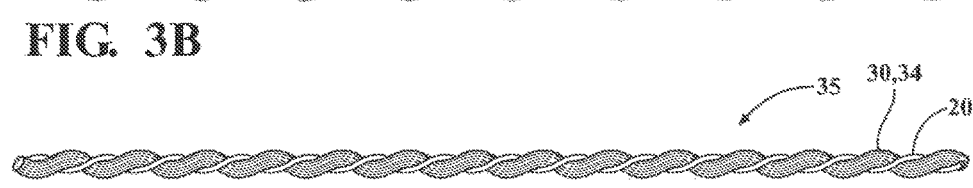
Figure 3D:
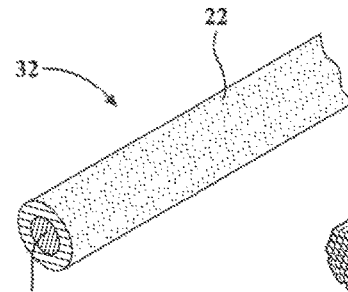
Figure 3E:
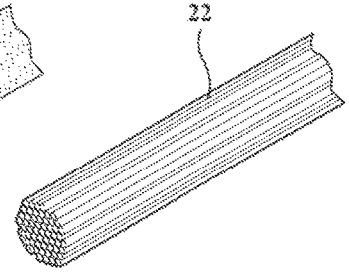
Figure 3F:
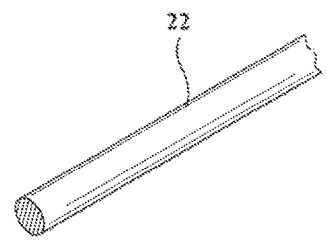
Figure 4B:
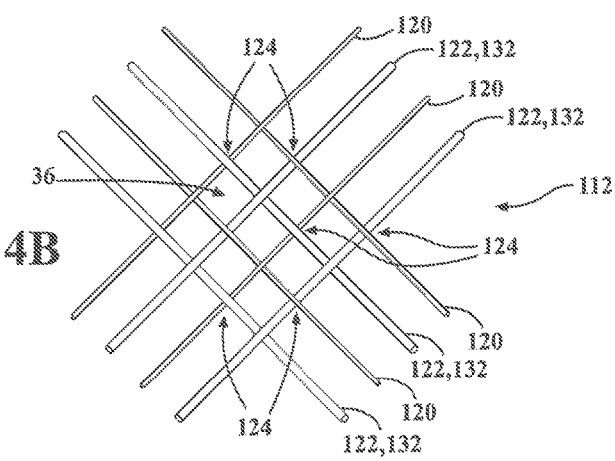

In FIG. 1B, a sleeve 110 constructed in accordance with another aspect of the invention is illustrated, wherein the same reference numerals as used above, offset by a factor of 100, are used to identify like features. The sleeve 110, rather than being woven, is braided to form a wall 112 having opposite edges 126, 128 extending generally parallel to a longitudinal axis 114 between opposite ends 116, 118. Of course, as with the sleeve 10, and as shown in FIG. 2, the wall 112 of the sleeve 110 can be formed as a circumferentially continuous and seamless wall. As best shown in FIGS. 4B-4E, different embodiments of the wall 112 can be constructed by braiding wire 120 with nonconductive, heat-fusible filaments 122 in various braid patterns and with different types of the filaments 120, 122. For example, the wire 120 can be provided as individual stands of wire, such as shown in FIG. 3A, or as a hybrid filament 135, such as shown in FIGS. 3B-3C, as discussed above. Further, the heat-fusible filament 122 can be provided as an individual strand of a heat-fusible material, such as a multifilament as shown in FIG. 3E, or as a monofilament as shown in FIG. 3F, or as a bicomponent filament 132 as shown in FIG. 3D, as discussed above. Upon braiding the wall 112, the wall 112 can be curled to bring the opposite edges 126, 128 into overlapping relation with one another, whereupon suitable heat can be applied to the curled wall 112 to simultaneously heat-set the heat-settable filament 130, if provided, without causing it to melt, and at least partially melt and then solidify the heat-fusible filament 122 to bond and fix the wires 120 in their "as braided" positions at the nodes 124. Accordingly, the wire 120 is prevented from shifting from its "as braided" and wrapped position upon being bonded and at least partially embedded in the heat-fused material of the heat-fusible filaments 122 at the nodes 124. It should be recognized that the wire 120 can be braided with the heat-fusible filaments 122 or bicomponent filaments 132 in various braided configurations, such as shown in FIG. 4B, wherein individual filaments of wire 120 are braided and bonded with heat-fusible filaments 122 or bicomponent filaments 132. Otherwise, the wire 120, via hybrid filaments 135, can be braided in side-by-side relation with heat-fusible filaments 122 or bicomponent filaments 132 (FIGS. 4C-4E). In FIGS. 4C and 4D, the hybrid yarn 135 is shown as a wire 120 twisted with a multifilament 134, such as discussed above with regard to FIG. 3C, and in FIG. 4E, the hybrid yarn 135 is shown as a wire 120 twisted with a nonconductive, heat-fusible monofilament 122. Regardless of how the wall 112 is braided, generally diamond-shaped openings 36 are formed and bounded by the continuous strand of conductive wire 120, wherein the generally diamond-shaped openings 36 are fixed in size by the bond joints 124, thereby assuring the desired braided pattern is maintained by the wires 120 to provide a reliable shield against electrical interference.

Figure 1C:
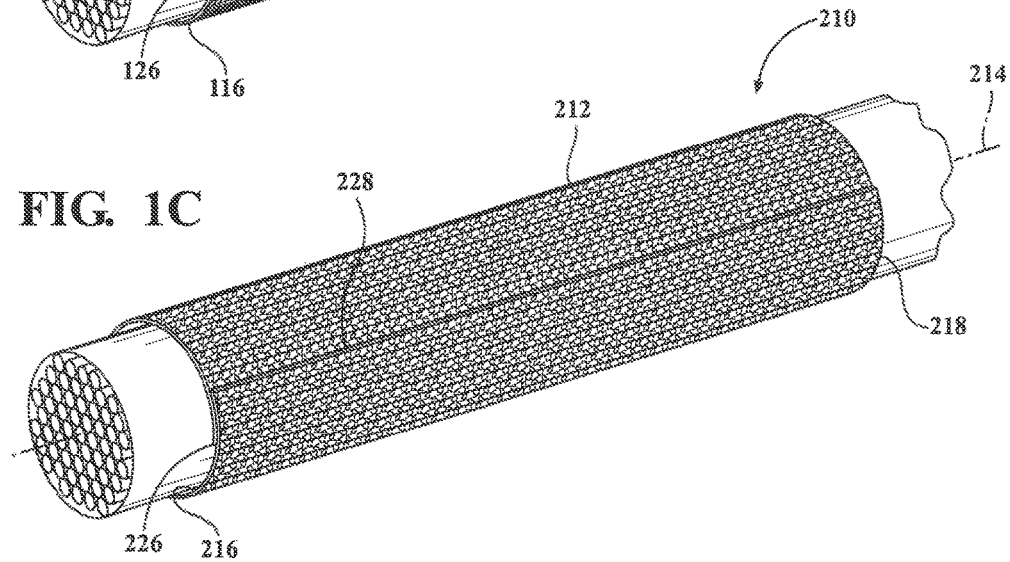
FIG. 1C is a perspective view of a self-wrapping sleeve constructed in accordance with another presently preferred embodiment of the invention.

In FIG. 1C, a sleeve 210 constructed in accordance with another aspect of the invention is illustrated, wherein the same reference numerals as used above, offset by a factor of 200, are used to identify like features. The sleeve 210, rather than being woven or braided, is knit with at least one wire, whether an individual wire or a hybrid yarn, as discussed above, and a heat-fusible member, whether a monofilament, multifilament or bicomponent, as discussed above, to form a wall 212 having opposite edges 226, 228 extending generally parallel to a longitudinal axis 214 between opposite ends 216, 218. Of course, the wall 212 is knit with at least one of the filaments being provided as a continuous strand of conductive wire (FIGS. 3A-3C) and at least some of the filaments are provided as heat-fusible nonconductive filaments (FIGS. 3D-3F). As with the previous embodiments, the knit heat-fusible nonconductive filaments abut the continuous strand of knit conductive wire at a plurality of bond joints or nodes to fix the wire in its "as bonded" position with the respective heat-fusible nonconductive filament. Of course, as with the previous woven and braided embodiments, the knit wall 212 can be formed as a circumferentially continuous and seamless wall (FIG. 2).

Obviously, many modifications and variations of the present invention are possible in light of the above teachings. It is, therefore, to be understood that within the scope of the appended claims, the invention may be practiced otherwise than as specifically described.

What is claimed is:

1. A method of constructing a fabric sleeve for protecting elongate members against at least one of EMI, RFI or ESD, comprising:
    forming a wall extending along a longitudinal axis between opposite ends by interlacing a plurality of filaments with one another and providing at least one of the filaments as a continuous strand of conductive wire, providing at least one of the filaments as a heat-settable nonconductive filament, and providing at least one of the filaments as a heat-fusible nonconductive filament;
    at least partially embedding said at least one continuous strand of conductive wire in said at least one heat-fusible nonconductive filament;
    curling the wall to bring opposite edges of the wall into overlapping relation with one another; and
    applying heat to the wall to heat-set said at least one heat-settable nonconductive filament without causing said heat-settable nonconductive filament to melt and to simultaneously melt said at least one heat-fusible nonconductive filament to fix said at least one continuous strand of conductive wire against relative movement with said at least one heat fusible nonconductive filament.

2. The method of claim 1 further including performing the interlacing in a weaving process.

3. The method of claim 2 further including weaving the at least one continuous strand of wire in a warp direction extending generally parallel to the longitudinal axis and in a weft direction extending generally transverse to the longitudinal axis.

4. The method of claim 3 further including providing the at least one heat-fusible nonconductive filament and the at least one heat-settable non-conductive filament as a bicomponent monofilament having an outer sheath of heat-fusible material having a first melt temperature and an inner core of heat-settable material having a second melt temperature that is greater than said first melt temperature.

5. The method of claim 4 further including heat-fusing the outer sheath in bonded, fixed attachment with the at least one continuous strand of conductive wire and biasing opposite edges of the wall into overlapping relation with one another by heat-setting the inner core.

6. The method of claim 5 further including providing the at least one continuous strand of conductive wire as a hybrid filament including the at least one continuous strand of conductive wire twisted or served with a non-conductive multifilament.

7. The method of claim 1 further including providing the at least one continuous strand of conductive wire as a hybrid filament including the at least one continuous strand of conductive wire twisted or served with a non-conductive multifilament.

8. The method of claim 1 further including performing the interlacing in a braiding process.

9. The method of claim 1 further including performing the interlacing in a knitting process.

10. The method of claim 1 further including providing the at least one heat-fusible nonconductive filament and the at least one heat-settable non-conductive filament as separate filaments.

\* \* \* \* \*